United States Patent
Campbell et al.

(10) Patent No.: US 6,867,996 B2
(45) Date of Patent: Mar. 15, 2005

(54) SINGLE-POLARITY PROGRAMMABLE RESISTANCE-VARIABLE MEMORY ELEMENT

(75) Inventors: Kristy A. Campbell, Boise, ID (US); John T. Moore, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 10/230,201

(22) Filed: Aug. 29, 2002

(65) Prior Publication Data

US 2004/0042259 A1 Mar. 4, 2004

(51) Int. Cl.[7] .............................................. G11C 17/00
(52) U.S. Cl. ........................ 365/100; 365/148; 365/163
(58) Field of Search ............................... 365/100, 148, 365/163; 257/2, 3, 5

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |

(List continued on next page.)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Yoji Kawamoto and Masaru Nishida, "Ionic Conduction in $As_2S_3$—$Ag_2S$, $GeS_2$—$GeS$—$Ag_2S$ and $P_2S_5$—$Ag_2S$ Glasses", Journal of Non–Crystalline Solids 20 (1976), pp. 393–404.

(List continued on next page.)

*Primary Examiner*—Son T. Dinh
(74) *Attorney, Agent, or Firm*—Dickstein Shapiro Morin & Oshinsky LLP

(57) ABSTRACT

A resistance variable memory element with improved data retention and switching characteristics switched between resistance memory states upon the application of write pulses having the same polarity. The resistance variable memory element can be provided having at least one silver-selenide layer in between glass layers, the glass layers are a chalcogenide glass having a $Ge_xSe_{100-x}$ composition.

90 Claims, 5 Drawing Sheets

U.S. PATENT DOCUMENTS

| | | |
|---|---|---|
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A * | 10/2000 | Ovshinsky et al. ......... 365/163 |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2000/0072188 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki |
| 2002/0190350 A1 | 12/2002 | Kozicki |

| | | |
|---|---|---|
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |
| 2003/0048744 A1 | 3/2003 | Ovshinsky et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25—xSbx, Appl. Phys. A 55 (1992) 167–169.

Afifi,M.A.; Labib, H.H.; fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu—As—Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe51: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M—Ag2Se—M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S–to N–type differential negative resistance in Al—Al2O3—Ag2—xSe1+x thin film structures, Phys. Stat. Sol. (a) 74 (1982) 217–224.

Bondarev, V.N.; Pikhitsa, P.V., A dendrite model of current instability in RbAg4l5, Solid State Ionics 70/71 (1994) 72–76.

Boolchand, P., The maximum in glass transition temperature (Tg) near x=1/3 in GexSe1—x.

Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P., de Neufville, J.P, Intrinsically broken chalcogen chemical order in stoichiometric glasses, Journal de Physique 42 (1981) C4–193—C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CulnSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D; Appl. Phys. 27 (1994) 2624–2627.

Chen, C.H.; Tai, K.L., Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous.

Silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2-xSe1+x/n-Si diodes, Thin Solid Films 110 (1983) 107–113.

El Gharras, Z.; Bourahla, A.; Vautier, C., Role of photoinduced defects in amorphous GexSe1-x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous seminconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/ metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/P+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V–thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S,; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering og Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Lemier, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L. Reversible and irreversible electrical switching in TeO2–V2O5 based glasses, Journal de Physique IV 2 (1992) C2–185 –C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on.
Electrical switching in chalcogenide network glasses, Phys. Rev. B 54 (1996) 4413–4415.
Ovshinsky S.R.; Fritzsche, H., Reversible structural transformations in amorphous semiconductors for memory and logic, Mettalurgical transactions 2 (1971) 641–645.
Ovshinsky, S.R., Reversible electrical switching phenomena in disordered structures, Phys. Rev. Lett. 21 (1968) 1450–1453.
Owen, A.E.; LeComber, P.G.; Sarrabayrouse, G.; Spear, W.E., New amorphous–silicon electrically programmable nonvolatile switching device, IEE Proc. 129 (1982) 51–54.
Owen, A.E.; Firth, A.P.; Ewen, P.J.S., Photo–induced structural and physico–chemical changes in amorphous chalcogenide semiconductors, Phil. Mag. B 52 (1985) 347–362.
Owen, A.E.; Le Comber, P.G.; Hajto, J.; Rose, M.J.; Snell, A.J., Switching in amorphous devices, Int. J. Electronics 73 (1992) 897–906.
Pearson, A.D.; Miller, C.E., Filamentary conduction in semiconducting glass diodes, App. Phys. Lett. 14 (1969) 280–282.
Pinto, R.; Ramanathan, K.V., Electric field induced memory switching in thin films of the chalcogenide system Ge–As–Se, Appl. Phys. Lett. 19 (1971) 221–223.
Popescu, C., The effect of local non–uniformities on thermal switching and high field behavior of structures with chalcogenide glasses, Solid–state electronics 18 (1975) 671–681.
Popescu, C.; Croitoru, N., The contribution of the lateral thermal instability to the switching phenomenon, J. Non–Cryst. Solids 8–10 (1972) 531–537.
Popov, A.I.; Geller, I.KH.; Shemetova, V.K., Memory and threshold switching effects in amorphous selenium, Phys. Stat. Sol. (a) 44 (1977) K71–K73.
Prakash, S.; Asokan, S.; Ghare, D.B., Easily reversible memory switching in Ge–As–Te glasses, J. Phys. D: Appl. Phys. 29 (1996) 2004–2008.
Rahman, S.; Sivarama Sastry, G., Electronic switching in Ge–Bi–Se–Te glasses, Mat. Sci. and Eng. B12 (1992) 219–222.
Ramesh, K.; Asokan, S.; Sangunni, K.S.; Gopal, E.S.R., Electrical Switching in germanium telluride glasses doped with Cu and Ag, Appl. Phys. A 69 (1999) 421–425.
Rose,M.J.;Hajto,J.;Lecomber,P.G.;Gage,S.M.;Choi,W.K-.;Snell,A.J.;Owen,A.E., Amorphous silicon analogue memory devices, J. Non–Cryst. Solids 115 (1989) 168–170.
Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.
Schoucker, D.; Rieder, G., On the reliability of amorphous chalcogenide switching devices, J. Non–Cryst. Solids 29 (1978) 397–407.
Sharma, A.K.; Singh, B., Electrical conductivity measurements of evaporated selenium films in vacuum, Proc. Indian Natn. Sci. Acad. 46, A, (1980) 362–368.
Sharma, P., Structural, electrical and optical properties of silver selenide films, Ind. J. Of pure and applied phys. 35 (1997) 424–427.
Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.
Steventon, A.G., Microfilaments in amorphous chalcogenide memory devices, J. Phys. D: Appl. Phys. 8 (1975) L120–L122.
Steventon, A.G., The switching mechanisms in amorphous chalcogenide memory devices, J. Non–Cryst. Solids 21 (1976) 319–329.
Stocker, H.J., Bulk and thin film switching and memory effects in semiconducting chalcogenide glasses, App. Phys. Lett. 15 (1969) 55–57.
Tanaka, K., Ionic and mixed conductions in Ag photodoping process, Mod. Phys. Lett B 4 (1990) 1373–1377.
Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.
Thornburg, D.D., Memory switching in a Type I amorphous chalcogenide, J. Elect. Mat. 2 (1973) 3–15.
Thornburg, D.D., Memory switching in amorphous arsenic triselenide, J. Non–Cryst. Solids 11 (1972) 113–120.
Thornburg, D.D.; White, R.M., Electric field enhanced phase separation and memory switching in amorphous arsenic triselenide, Journal(??) (1972) 4609–4612.
Tichy, L.; Ticha, H., Remark on the glass–forming ability in GexSe1–x and AsxSe1–x systems, J. Non–Cryst. Solids 261 (2000) 277–281.
Titus, S.S.K.; Chatterjee, R.; Asokan, S., Electrical switching and short–range order in As–Te glasses, Phys. Rev. B 48 (1993) 14650–14652.
Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.
Tregouet, Y.; Bernede, J.C., Silver movements in Ag2Te thin films: switching and memory effects, Thin Solid Films 57 (1979) 49–54.
Uemura, O.; Kameda, Y.; Kokai, S.; Satow, T., Thermally induced crystallization of amorphous Ge0.4Se0.6, J. Non–Cryst. Solids 117–118 (1990) 219–221.
Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.
Viger, C.; Lefrancois, G.; Fleury, G., Anomalous behaviour of amorphous selenium films, J. Non–Cryst. Solids 33 (1976) 267–272.
Vodenicharov, C.; Parvanov,S.; Petkov,P., Electrode–limited currents in the thin–film M–GeSE–M system, Mat. Chem. and Phys. 21 (1989) 447–454.
Wang, S.–J.; Misium, G.R.; Camp, J.C.; Chen, K.–L.; Tigelaar, H.L., High–performance Metal/silicide antifuse, IEEE electron dev. Lett. 13 (1992)471–472.
Weirauch, D.F., Threshold switching and thermal filaments in amorphous semiconductors, App. Phys. Lett. 16 (1970) 72–73.
West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavoir in the slope |dTg/d<m>| at the rigidity percolation threshold (<m>=2.4), J. Non–Cryst. Solids 151 (1992) 149–154.

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive* sputter etching in $SF_6$, 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40, No 5, 625–684 (1991).

Kozicki, et al., "Applications of Programmable Resistance Changes in Metal–doped Chalcogenides ", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solitions*, Superlattices and Microstructures, 27, 485–488 (2000).

Kozicki, et al., *Nanoscale phase separation in Ag–Ge–Se glasses*, Microelectronic Engineering, vol. 63/1–3, 155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987)f.

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3365 (1973).

* cited by examiner

SINGLE-POLARITY PROGRAMMABLE RESISTANCE-VARIABLE MEMORY ELEMENT

FIELD OF THE INVENTION

The invention relates to the field of random access memory (RAM) devices formed using a resistance variable material, and in particular to a method and apparatus for writing a particular resistance state of a chalcogenide glass memory element.

BACKGROUND OF THE INVENTION

Recently, resistance variable memory elements, which include programmable conductor memory elements based on chalcongenide glasses, have been investigated for suitability as semi-volatile and non-volatile random access memory elements.

The mechanism by which the resistance of a chalcogenide glass memory element is changed is not fully understood. In one theory, the conductively-doped dielectric material undergoes a structural change at a certain applied voltage. It is surmised that a conductive dendrite or filament grows under influence of the applied voltage to extend between the electrodes, effectively interconnecting the two electrodes and setting the memory element to a low resistance state. The dendrite is thought to grow through the resistance variable material along a path of least resistance.

The low resistance state will remain intact for days or weeks after the voltage potentials are removed. Such materials can be returned to a high resistance state by applying a reverse voltage potential between the electrodes, the reverse potential having at least the same order of magnitude as was used to write the element to the low resistance state. Again, the highly resistive state is maintained once the voltage potential is removed. This way, such a device can function, for example, as a resistance variable memory element having two resistance states, which can define two logic states.

As noted above, resistance variable materials of particular interest include chalcogenide glasses doped with a conductive substance that will disperse or migrate within the glass. A specific example is germanium-selenide glass ($Ge_xSe_{100-x}$), doped with silver (Ag). Another example is a germanium-selenide glass ($Ge_xSe_{100-x}$) which receives silver ions through an adjacent silver-selenide ($Ag_2Se$) layer.

Known memory elements based on silver-containing chalcogenide materials require that pulses of reverse polarity be applied to switch the memory element between the different resistance states. Since it is often inconvenient to supply a negative potential power source to a memory device, it would be desirable to have a resistance variable memory element which switches between resistance memory states using different levels of a positive voltage.

BRIEF SUMMARY OF THE INVENTION

In a first embodiment, the invention provides a resistance variable memory element in which a metal, e.g., silver, containing layer is formed between two chalcogenide glass layers, the memory element being switchable between two resistance states by application of write voltage pulses of different levels but of the same polarity.

The metal-containing layer may be a layer of silver-selenide formed between the two chalcogenide glass layers.

According to a second embodiment, the invention provides a memory element including a plurality of alternating layers of chalcogenide glass and metal containing layers, whereby the layers start with a first chalcogenide glass layer and end with a last chalcogenide glass layer, with the first chalcogenide glass layer contacting a first electrode and the last chalcogenide glass layer contacting a second electrode. The plurality of alternating layers of chalcogenide glass layers and metal containing layers are stacked between two electrodes. The metal containing layers preferably include a silver-chalcogenide, such as silver-selenide. The memory element of the second embodiment is also switchable between two resistance states by application of write voltage pulses of different levels but of the same polarities.

These and other features and advantages of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including but not limited to a semiconductor substrate or a non-semiconductor substrate. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess (+x) or deficit (−x) of silver, for instance, $Ag_2Se$, $Ag_{2+x}Se$, and $Ag_{2-x}Se$.

The term "chalcogenide glass" is intended to include glasses that contain an element from group VIA (or group 16) of the periodic table. Group VIA elements, also referred to as chalcogens, include sulfur (S), selenium (Se), tellurium (Te), polonium (Po), and oxygen (O).

Figure 1:
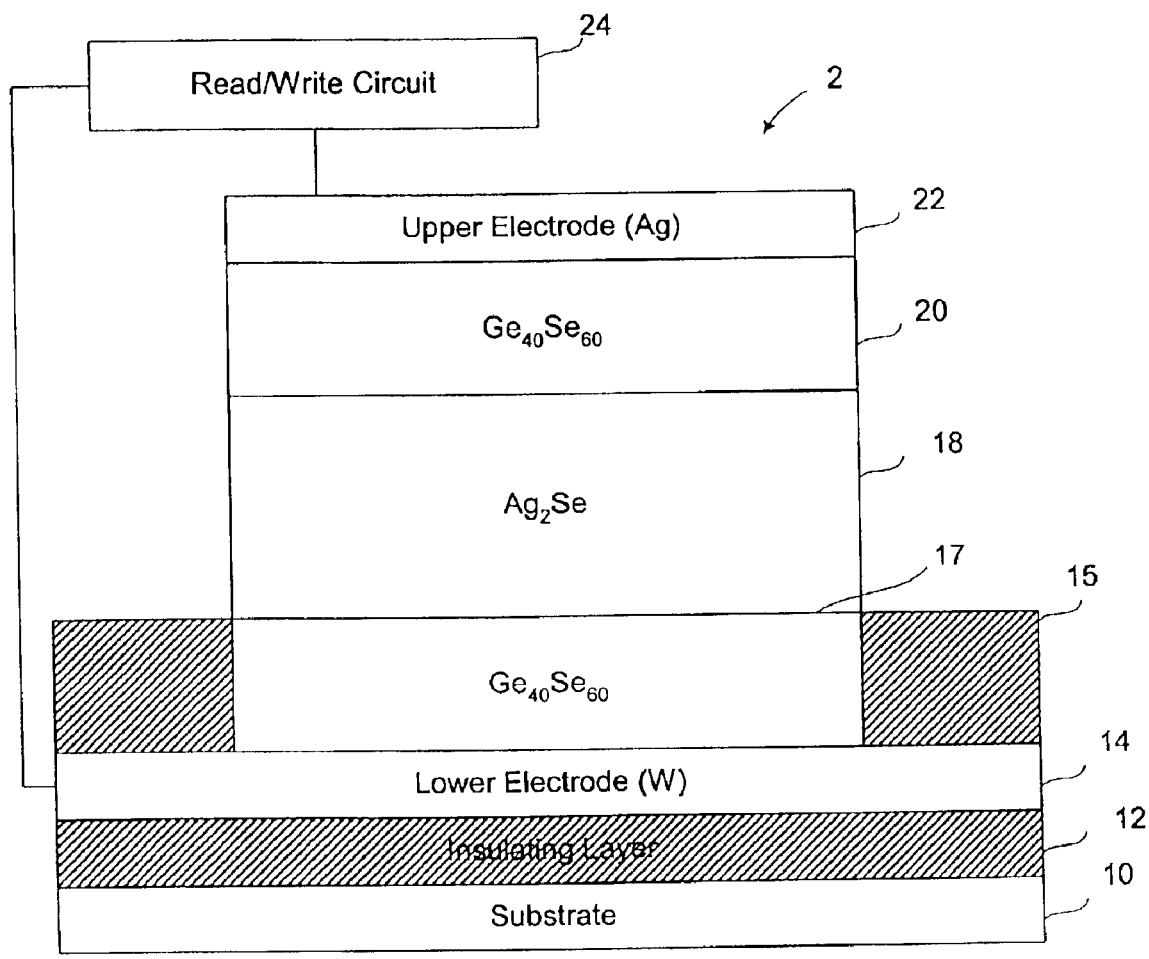
FIG. 1 illustrates a cross-sectional view of a simplified memory element and an accompanying read/write circuit in accordance with an exemplary embodiment of the present invention.

The invention will now be explained with reference to FIG. 1, which illustrates an exemplary embodiments of a resistance variable memory element 2 in accordance with the invention. FIG. 1 depicts a portion of an insulating layer 12 formed over a substrate 10, for example, a silicon substrate. It should be understood that the resistance variable memory element can be formed over a variety of substrate materials and not just semiconductor substrates such as silicon. For example, the insulating layer 12 may be formed over a plastic substrate.

The insulating layer 12 may be formed by any known deposition methods, such as sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$), or a low dielectric constant material, among many others.

A first electrode 14 is next formed over the insulating layer 12, as also illustrated in FIG. 1. The first electrode 14 may include any conductive material, for example, tungsten, nickel, tantalum, aluminum, or platinum, among many others. A first dielectric layer 15 is next formed over the first electrode 14. The first dielectric layer 15 may include the same or different materials as those described above with reference to the insulating layer 12.

An opening extending to the first electrode 14 is formed in the first dielectric layer 15 by known methods in the art, for example, by a conventional patterning and etching process. A first chalcogenide glass layer 17 is next formed over the first dielectric layer 15, to fill in the opening.

According to a first exemplary embodiment of the invention, the first chalcogenide glass layer 17 is a germanium-selenide glass having a $Ge_xSe_{100-x}$ stoichiometry. The preferred stoichiometric range is between about $Ge_{18}Se_{82}$ to about $Ge_{43}Se_{57}$ and is more preferably about $Ge_{40}Se_{60}$. The first chalcogenide glass layer 17 preferably has a thickness from about 100 Å to about 1000 Å and is more preferably about 150 Å.

The first chalcogenide glass layer acts as a glass backbone for allowing a conductive, metal-containing layer, such as a silver-selenide layer, to be directly deposited thereon. The use of a metal containing layer, such as a silver-selenide layer, in contact with the chalcogenide glass layer makes it unnecessary to provide a metal (silver) doped chalcogenide glass, which would require photodoping of the substrate with light radiation. It is possible, however, to also metal (silver) dope the chalcogenide glass layer, which is in contact with the silver-selenide layer, as an optional variant.

The formation of the first chalcogenide glass layer 17, having a stoichiometric composition in accordance with the invention, may be accomplished by any suitable method. For instance, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry are examples of methods which may be used to form the first chalcogenide glass layer 17.

A first metal containing layer 18, preferably silver-selenide, is deposited over the first chalcogenide glass layer 17. Any suitable metal containing layer may be used, including, for instance, silver-chalcogenide layers. Silver sulfide, silver oxide, and silver telluride are all suitable silver-chalcogenides that may be used in combination with any suitable chalcogenide glass layer. A variety of processes can be used to form the silver-selenide layer 18. For instance, physical vapor deposition techniques such as evaporative deposition and sputtering may be used. Other processes such as chemical vapor deposition, co-evaporation, or depositing a layer of selenium above a layer of silver to form silver-selenide can also be used.

The layers may be any suitable thickness. The thickness of the layers depend upon the desired electrical switching characteristics. The thickness of the layers is such that the metal containing layer is thicker than the first chalcogenide glass layer. The metal containing layer is also thicker than a second chalcogenide glass layer, described below. More preferably, the thicknesses of the layers are such that a ratio of the silver-selenide layer thickness to the first chalcogenide glass layer thickness is between about 5:1 and about 1:1. In other words, the thickness of the silver-selenide layer is between about 1 to about 5 times greater than the thickness of the first chalcogenide glass layer. Even more preferably, the ratio is between about 3.1:1 and about 2:1 silver-selenide layer thickness to first chalcogenide glass layer thickness.

A second chalcogenide glass layer 20 is formed over the first silver-selenide layer 18. The second chalcogenide glass layer allows deposition of silver above the silver-selenide layer since silver cannot be directly deposited on silver-selenide. Also, it is believed that the second chalcogenide glass layer may prevent or regulate migration of metal, such as silver, from an electrode into the element. Accordingly, although the exact mechanism by which the second chalcogenide glass layer may regulate or prevent metal migration is not clearly understood, the second chalcogenide glass layer may act as a silver diffusion control layer. The second chalcogenide glass layer may, but need not, have the same stoichiometric composition as the first chalcogenide glass layer, e.g., $Ge_xSe_{100-x}$. Thus, the second chalcogenide glass layer 20 may be of a different material, different stoichiometry, and/or more rigid than the first chalcogenide glass layer 17.

The thickness of the layers are such that the silver-selenide layer 18 thickness is greater than the thickness of the second chalcogenide glass layer 20. Preferably, a ratio of the silver-selenide layer thickness to the second chalcogenide glass layer thickness is between about 5:1 and about 1:1. More preferably, the ratio of the silver-selenide layer thickness to the thickness of the second chalcogenide glass layer is between about 3.3:1 and about 2:1 silver-selenide layer thickness to second chalcogenide glass layer thickness. The second chalcogenide glass layer 20 preferably has a thickness between about 100 Å to about 1000 Å and is more preferably 150 Å.

The formation of the second chalcogenide glass layer 20 may be accomplished by any suitable method. For instance, chemical vapor deposition, evaporation, co-sputtering, or sputtering using a target having the desired stoichiometry, may be used.

A second conductive electrode material 22 is formed over the second chalcogenide glass layer 20. As with the first conductive electrode, the second conductive electrode material 22 may include any electrically conductive material, for example, tungsten, tantalum, titanium, or silver, among many others. Typically, the second conductive electrode material 22 includes silver. Thus, advantageously, the second chalcogenide glass layer 20 may be chosen to considerably slow or prevent migration of electrically conductive metals, such as silver, through the resistance variable memory element 2.

One or more additional dielectric layers may be formed over the second electrode 22 and the first dielectric layer 15 to isolate the resistance variable memory element 2 from other structure fabricated over the substrate 12. Conventional processing steps can then be carried out to electrically couple the second electrode 22 to various circuits of memory arrays.

A resistance variable memory element made of a PCRAM stack fabricated as described has been observed to switch to a low resistance state upon application of a first positive write pulse across the upper and lower electrodes, and to switch to a high resistance state upon application of a second higher positive write pulse across the electrodes. The pulses are applied by read/write circuit 24 as shown diagramatically in FIG. 1. The first and second positive write pulses may have a pulse width of less than or equal to 8 nanoseconds. The FIG. 1 device switches to a low resistance state when the first write pulse has a magnitude of in the range of about 500 mV to about 1 V. The low resistance state is about 1 to 10 KΩ, and thus can be obtained with a write pulse as low as about 500 mV. The device switches to a high resistance state when a second positive write pulse is applied having a magnitude of at least approximately 2.5 V, providing a high resistance state in the Megohm range. Pulse widths longer than 8 nanoseconds can be used, and with the appropriate potential, can exceed 1 microsecond. Thus, the resistance variable memory element of the present invention is switchable between two discrete resistance states, one lower and the other high, upon application of positive write voltage pulses.

Either resistance state can be read upon application of a positive voltage of less than 400 mV which will not erase the memory or cause a resistance change in the memory element. A destructive read is also possible, whereby a negative or positive potential could be used to read the device and concomitantly perturb the state of the memory cell which then needs to be refreshed to its original memory state.

In accordance with a variation of the first embodiment of the invention, one or more layers of a metal containing material, such as silver-selenide, may be deposited on the first chalcogenide glass layer 17. Any number of silver-selenide layers may be used. Thus, an optional second silver-selenide layer may be deposited on the first silver-selenide layer 18.

The thickness of the layers is such that the total thickness of the combined metal containing layers, e.g., silver-selenide layers, is greater than or equal to the thickness of the first chalcogenide glass layer. The total thickness of the combined metal containing layers is also greater than the thickness of the second chalcogenide glass layer. It is preferred that the total thickness of the combined metal containing layers is between about 1 to about 5 times greater than the thickness of the first chalcogenide glass layer and accordingly between about 1 to about 5 times greater than the thickness of the second chalcogenide glass layer. It is even more preferred that the total thickness of the combined metal containing layers is between about 2 to about 3.3 times greater than the thicknesses of the first chalcogenide glass layer and the second chalcogenide glass layer.

In accordance, with yet another variation of the invention, the first chalcogenide glass layer may include one or more layers of a chalcogenide glass material, such as germanium-selenide. The second chalcogenide glass layer may also include one or more layers of a chalcogenide glass material. Any suitable number of layers may be used to include the first chalcogenide glass layer and/or the second chalcogenide glass layer. It is to be understood, however, that the total thickness of the metal containing layer(s) should be thicker than the total thickness of the one or more layers of chalcogenide glass and additionally the total thickness of the metal containing layer(s) should be thicker than the total thickness of the one or more layers of the second chalcogenide glass layer. Preferably a ratio of the total thickness of the metal containing layer(s) to the total thickness of the one or more layers of chalcogenide glass is between about 5:1 and about 1:1. Also, a ratio of the total thickness of the metal containing layer(s) to the total thickness of the one or more layers of the second chalcogenide glass preferably is between about 5:1 and about 1:1. It is even more preferred that the total thickness of the metal containing layer(s) is between about 2 to about 3.3 times greater than the total thicknesses of the combined one or more layers of chalcogenide glass and the total thickness of the combined one or more layers of the second chalcogenide glass.

In accordance with yet another variant of the invention, one or more of the chalcogenide glass layers may also be doped with a dopant, such as a metal, preferably silver.

Figure 2:
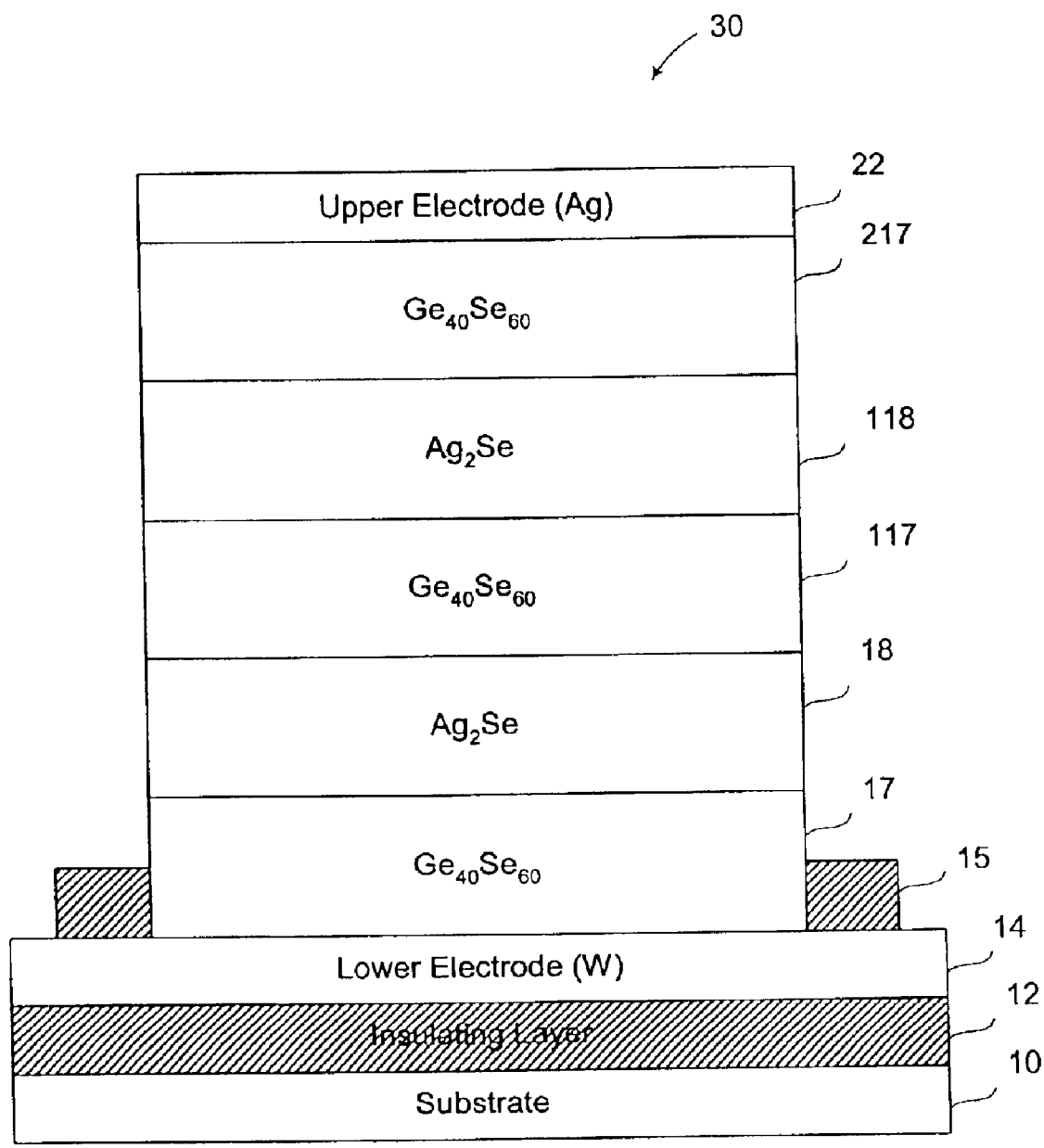
FIG. 2 illustrates a cross-sectional view of a simplified memory element in accordance with an alternative exemplary embodiment of the present invention.

Referring now to FIG. 2, a second exemplary embodiment of the present invention is illustrated in which the stack of layers formed between the first and second electrodes may include alternating layers of chalcogenide glass and a metal containing layer such as a silver-selenide layer. As shown in FIG. 2, memory element 30 includes a first chalcogenide glass layer 17 stacked atop a first electrode 14. A first silver-selenide layer 18 is stacked atop the first chalcogenide glass layer 17, a second chalcogenide glass layer 117 is stacked atop the first silver-selenide layer 18, a second silver-selenide layer 118 is stacked atop the second chalcogenide glass layer 117, and a third chalcogenide glass layer 217 is stacked atop the second silver-selenide layer 118. The second conductive electrode 22 is formed over the fourth chalcogenide glass layer.

In accordance with the second embodiment, the stack includes at least two metal containing layers and at least three chalcogenide glass layers. However, it is to be understood that the stack may include numerous alternating layers of chalcogenide glass and silver-selenide, so long as the alternating layers start with a first chalcogenide glass layer and end with a last chalcogenide glass layer, with the first chalcogenide glass layer contacting a first electrode and the last chalcogenide glass layer contacting a second electrode. The thickness and ratios of the alternating layers of silver-selenide and chalcogenide glass are the same as described above, in that the silver-selenide layers are preferably thicker than connecting chalcogenide glass layers, in a ratio of between about 5:1 and about 1:1 silver-selenide layer to connected chalcogenide glass layer, and more preferably between about 3.3:1 and 2:1 silver-selenide layer to connected chalcogenide glass layer.

In a variation of the second embodiment, one or more layers of a metal containing material, such as silver-selenide may be deposited between the chalcogenide glass layers. Any number of silver-selenide layers may be used. In an additional variation, one or more Ag layer(s) can be included alternately with the silver-selenide layers.

In accordance, with yet another variation of the invention, each of the chalcogenide glass layers may include one or more thinner layers of a chalcogenide glass material, such as germanium-selenide. Any suitable number of layers may be used to include the chalcogenide glass layers.

In yet another variation of the second embodiment of the invention, one or more of the chalcogenide glass layers may also be doped with a dopant such as a metal, preferably including silver.

Figure 3:
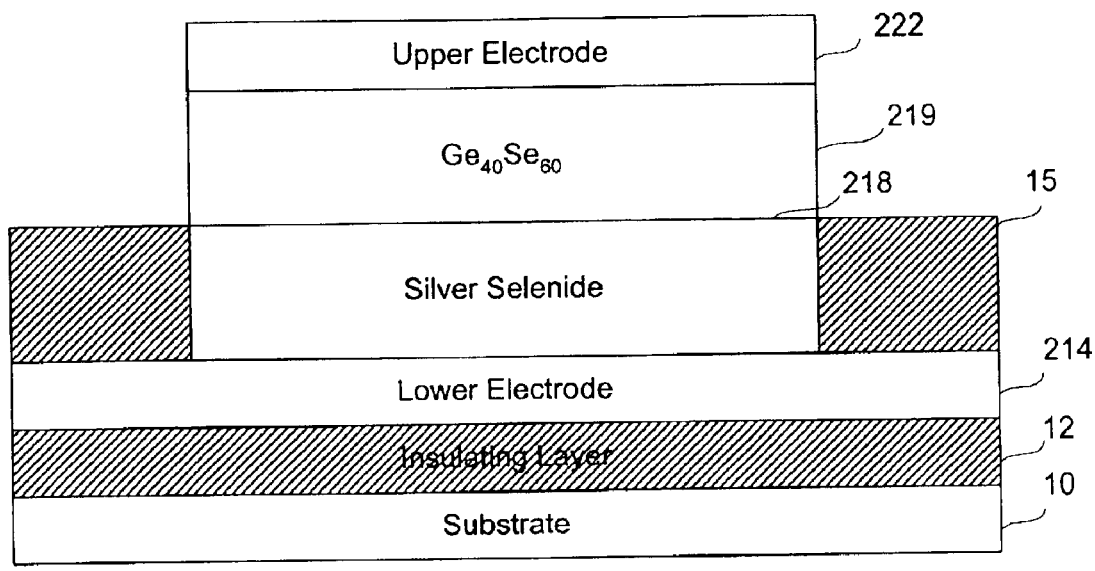
FIG. 3 illustrates a cross-sectional view of a simplified memory element in accordance with another alternative exemplary embodiment of the present invention.

Referring to FIG. 3, a simplified structure of a third exemplary embodiment of a memory cell according to the present invention is shown in which a silver selenide layer 219 is formed on an electrode 214. Over the silver selenide a layer of $Ge_{40}Se_{60}$ glass is disposed, on which an upper electrode 222 containing silver is provided. According to an alternative version, silver selenide layer 218 is composed of $Ag_{2+x}Se$, in which case upper electrode 222 need not contain silver due to the extra silver in layer 218.

Figure 4:
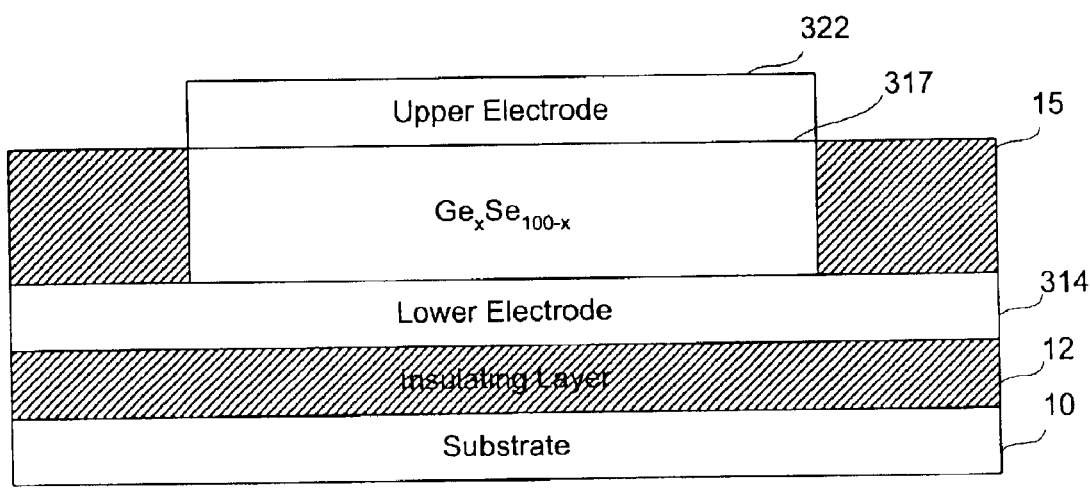
FIG. 4 illustrates a cross-sectional view of a simplified memory element in accordance with a further alternative exemplary embodiment of the present invention.

Referring to FIG. 4, a fourth exemplary embodiment of the present invention is shown in which a silver-doped glass layer 317 is sandwiched between two electrodes 314 and 322. The silver-doped glass composition $Ge_xSe_{100-x}$ needs to be in a stoichiometric range from $Ge_{18}Se_{82}$ to $Ge_{43}Se_{57}$, and preferably $Ge_{25}Se_{75}$ doped with silver either fully or within 1–10% of the maximum amount of silver allowed to keep the material amorphous. The preferred silver-doped glass compositions are described in commonly-assigned U.S. patent application Ser. No. 10/849,237 the disclosure of which is incorporated herein by reference.

Figure 5:
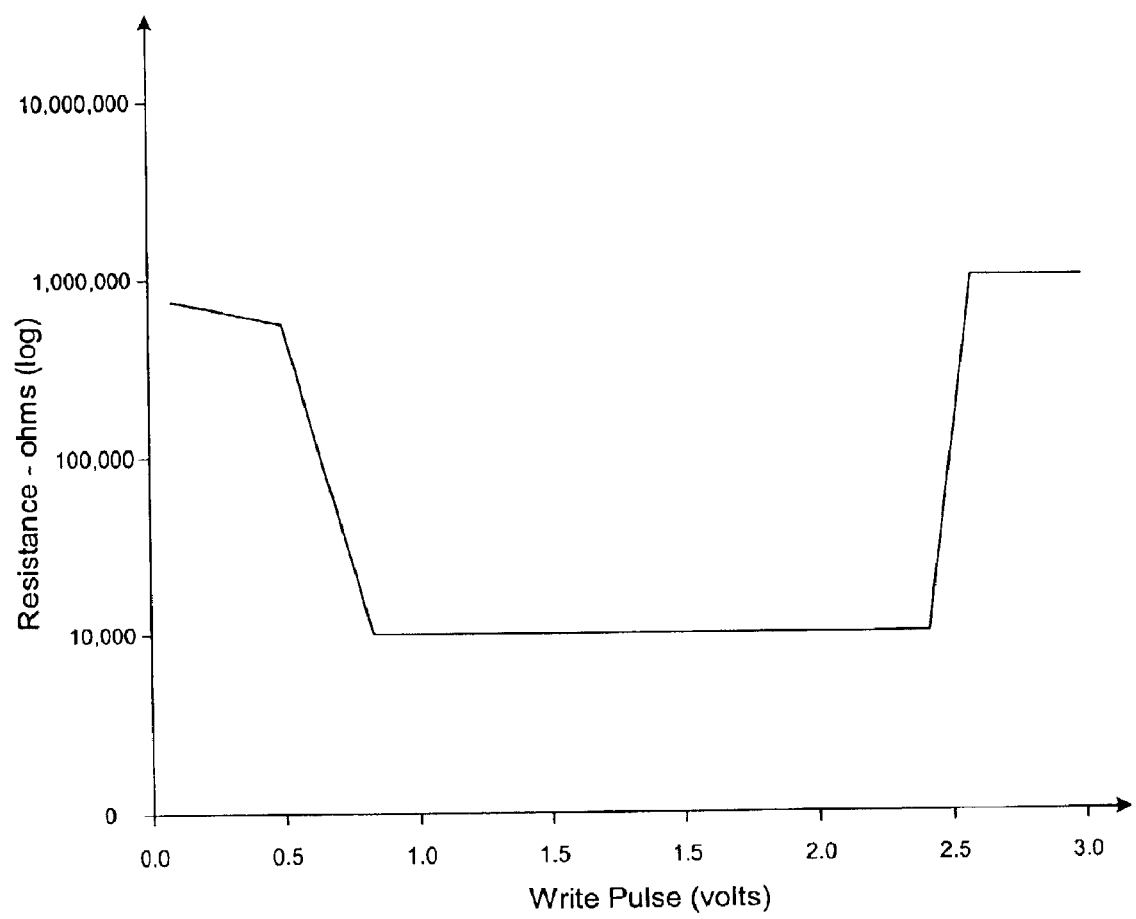
FIG. 5 is a graph illustrating write voltages and resistance states of the memory elements of the present invention.

Devices constructed according to the invention exhibit single polarity switching as illustrated in the graph of FIG. 5. Those having a silver-selenide layer disposed between two chalcogenide glass layers, in particular, are switchable between two resistance states using positive voltage pulses, and show improved memory retention and write/erase performance over conventional memory devices. These devices have also shown low resistance memory retention better than 1200 hours at room temperature.

Although the embodiments described above refer to the formation of only one resistance variable memory element 2, it must be understood that the invention contemplates the formation of any number of such resistance variable memory elements, which can be fabricated in a memory array and operated with memory element access circuits.

Figure 6:
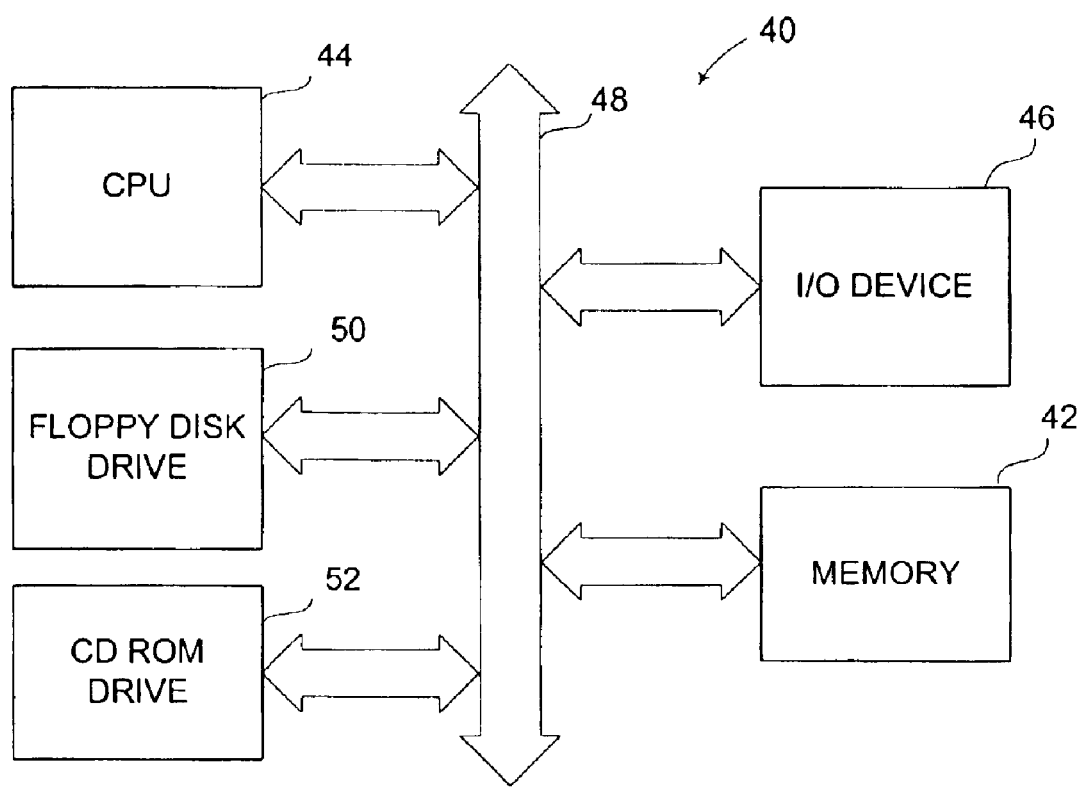
FIG. 6 illustrates a processor-based system having a memory including memory elements in accordance with an exemplary embodiment of the present invention.

FIG. 6 illustrates a typical processor-based system 40 which includes a memory circuit 42, for example a programmable conductor RAM, which employs resistance variable memory elements fabricated in accordance with the invention. A processor system, such as a computer system, generally includes a central processing unit (CPU) 44, such as a microprocessor, a digital signal processor, or other programmable digital logic devices, which communicates with an input/output (I/O) device 46 over a bus 48. The memory 42 communicates with the system over bus 48 typically through a memory controller.

In the case of a computer system, the processor system may include peripheral devices such as a floppy disk drive 50 and a compact disc (CD) ROM drive 52, which also communicate with CPU 44 over the bus 48. Memory 42 is preferably constructed as an integrated circuit, which includes one or more resistance variable memory elements 2. If desired, the memory 42 may be combined with the processor, for example CPU 44, in a single integrated circuit.

The above description and drawings are only to be considered illustrative of exemplary embodiments which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A resistance variable memory element comprising:
a structure comprising at least one chalcogenide glass layer formed between a pair of electrodes, said layer being constructed and arranged such that a resistance value of said memory element switches from a higher to lower resistance state upon application of a positive voltage in a first voltage range and from a lower to higher resistance state upon application of a positive voltage in a second voltage range.

2. The memory element of claim 1 wherein said at least one chalcogenide glass layer comprises a plurality of chalcogenide glass layers.

3. The memory element of claim 1 further comprising at least two chalcogenide glass layers arranged to sandwich at least one metal-containing layer between said two chalcogenide glass layers.

4. The memory element of claim 1 wherein said at least one chalcogenide glass layer comprises a material having the formula $Ge_xSe_{100-x}$, wherein x=18 to 43.

5. The memory element of claim 1 wherein said at least one chalcogenide glass layer stoichiometry is about $Ge_{40}Se_{60}$.

6. The memory element of claim 1 wherein said at least one chalcogenide glass layer has a thickness between about 100 Å and about 1000 Å.

7. The memory element of claim 1 wherein said at least one chalcogenide glass layer has a thickness of about 150 Å.

8. The memory element of claim 1, further comprising at least one metal containing layer disposed with said chalcogenide glass layer between said electrodes.

9. The memory element of claim 8 wherein said at least one metal containing layer comprises a silver-chalcogenide.

10. The memory element of claim 8 wherein said at least one metal containing layer comprises silver-selenide.

11. The memory element of claim 8 wherein said at least one metal containing layer comprises silver-sulfide.

12. The memory element of claim 8 wherein said at least one metal containing layer comprises silver-oxide.

13. The memory element of claim 8 wherein said at least one metal containing layer comprises silver-telluride.

14. The memory element of claim 8 wherein said at least one metal containing layer has a first thickness and said at least one chalcogenide glass layer has a second thickness whereby a thickness ratio of said first thickness to said second thickness is between about 5:1 to about 1:1.

15. The memory element of claim 8 wherein said at least one metal containing layer has a first thickness and said at least one chalcogenide glass layer has a second thickness whereby a thickness ratio of said first thickness to said second thickness is between about 3.3:1 to about 2:1.

16. The memory element of claim 8 wherein said at least one metal containing layer comprises a plurality of stacked metal containing layers.

17. The memory element of claim 16 where at least one of the stacked metal containing layers is a layer containing silver.

18. The memory element of claim 8 further comprising at least two metal containing layers and at least three chalcogenide glass layers arranged alternately.

19. The memory element of claim 1 wherein at least one of said at least one chalcogenide glass layers or said electrodes contains a metal dopant.

20. The memory element of claim 19 wherein said metal dopant comprises silver.

21. A resistance variable memory device comprising:
 at least one memory element comprising at least one chalcogenide glass layer; and
 a write circuit for applying a first positive voltage to said memory element to switch said memory element from a first resistance state to a second resistance state and for applying a second positive voltage to switch said memory element from said second resistance state to said first resistance state.

22. The memory device of claim 21 wherein said at least one silver-chalcogenide layer comprises silver-selenide.

23. The memory device of claim 21 wherein said at least one silver-chalcogenide layer comprises silver-sulfide.

24. The memory device of claim 21 wherein said at least one silver-chalcogenide layer comprises silver-oxide.

25. The memory device of claim 21 wherein said at least one silver-chalcogenide layer comprises silver-telluride.

26. The memory device of claim 21 wherein said chalcogenide glass material has the formula $Ge_xSe_{100-x}$, wherein x=18 to 43.

27. The memory device of claim 26 wherein said chalcogenide glass material stoichiometry is about $Ge_{40}Se_{60}$.

28. The memory device of claim 21 wherein at least one of said chalcogenide glass layers or said electrodes contains a metal dopant.

29. The memory device of claim 28 wherein said metal dopant comprises silver.

30. The memory device of claim 21 comprising first and second silver-chalcogenide layers, wherein said first silver-chalcogenide layer has a first thickness, said second chalcogenide glass layer has a second thickness, and a thickness ratio of said first thickness to said second thickness is between about 5:1 to about 1:1.

31. The memory device of claim 30 wherein said silver-chalcogenide layer has a first thickness, said second chalcogenide glass layer has a second thickness, and a thickness ratio of said first thickness to said second thickness is between about 3.3:1 to about 2:1.

32. The memory element of claim 30, wherein at least one of said first and second chalcogenide glass layers contains a metal dopant.

33. The memory element of claim 32 wherein said metal dopant comprises silver.

34. A memory element comprising:
 a first electrode;
 a first glass layer comprising $Ge_xSe_{100-x}$, wherein x=18 to 43, said first glass layer being electrically coupled with said first electrode;
 a first metal containing layer in contact with said first glass layer;
 a second chalcogenide glass layer in contact with said first metal containing layer; and
 a second electrode electrically coupled with said second chalcogenide glass layer, said memory element being constructed and arranged such that a resistance value of said memory element switches from a higher to lower resistance state upon application of a positive voltage in a first voltage range and from a lower to higher resistance state upon application of a positive voltage in an second voltage range.

35. The memory element of claim 34 wherein x is about 40.

36. The memory element of claim 34 wherein said first metal containing layer comprises a silver-chalcogenide.

37. The memory element of claim 34 wherein said first metal containing layer comprises silver-selenide.

38. The memory element of claim 34 wherein said first metal containing layer comprises silver-sulfide.

39. The memory element of claim 34 wherein said first metal containing layer comprises silver-oxide.

40. The memory element of claim 34 wherein said first metal containing layer comprises silver-telluride.

41. The memory element of claim 34 wherein said first metal containing layer comprises a plurality of metal containing layers in serial contact with each other.

42. The memory element of claim 34 wherein at least one of said first glass layer and said second chalcogenide glass layer comprises a plurality of glass layers in serial contact with each other.

43. The memory element of claim 34 wherein at least one of said first and second chalcogenide glass layers contains a metal dopant.

44. The memory element of claim 43 wherein said metal dopant comprises silver.

45. A chalcogenide glass stack comprising:
 a chalcogenide glass layer;
 at least one metal containing layer in contact with said chalcogenide glass layer; and
 a second chalcogenide glass layer in contact with said metal containing layer, said chalcogenide glass stack being constructed and arranged such that a resistance value of said memory element switches from a higher to lower resistance state upon application of a positive voltage in a first voltage range and from a lower to higher resistance state upon application of a positive voltage in an second voltage range different from said first voltage range.

46. The chalcogenide glass stack of claim 45 further comprising a metal containing electrode in electrical communication with said second chalcogenide glass layer.

47. The chalcogenide glass stack of claim 45 wherein said at least one metal containing layer comprises a silver-chalcogenide.

48. The chalcogenide glass stack of claim 45 wherein said at least one metal containing layer comprises silver-selenide.

49. The chalcogenide glass stack of claim 45 wherein said at least one metal containing layer comprises silver-sulfide.

50. The chalcogenide glass stack of claim 45 wherein said at least one metal containing layer comprises silver-oxide.

51. The chalcogenide glass stack of claim 45 wherein said at least one metal containing layer comprises silver-telluride.

52. The chalcogenide glass stack of claim 45 wherein at least one or both of said chalcogenide glass layers contains a metal dopant.

53. The chalcogenide glass stack of claim 52 wherein said metal dopant comprises silver.

54. A memory element comprising:
 a first electrode;
 at least one first chalcogenide glass layer in electrical communication with said first electrode;
 at least one first metal containing layer in contact with said at least one first chalcogenide glass layer;
 at least one second chalcogenide glass layer in contact with said at least one first metal containing layer;
 at least one second metal containing layer in contact with said at least one second chalcogenide glass layer;
 at least one third chalcogenide glass layer in contact with said at least one second metal containing layer; and
 a second electrode in electrical communication with said at least one third chalcogenide glass layer, said memory element being constructed and arranged such that a resistance value of said memory element switches from a higher to lower resistance state upon application of a positive voltage in a first voltage range and from a lower to higher resistance state upon application of a positive voltage in an second voltage range, said second voltage range being different from the first voltage range.

55. The memory element of claim 54 wherein said metal containing layers comprise one or more silver-selenide layers.

56. The memory element of claim 54 wherein one or more of said chalcogenide glass layers comprise a plurality of chalcogenide glass layers.

57. The memory element of claim 54 wherein one or more of said metal containing layers comprises a plurality of metal containing layers.

58. The memory element of claim 54 wherein one or more of said chalcogenide glass layers contains a metal dopant.

59. The memory element of claim 58 wherein said metal dopant comprises silver.

60. A processor-based system, comprising:
a processor; and
a memory circuit connected to said processor, said memory circuit including a resistance variable memory element comprising at least one metal containing layer, at least one chalcogenide glass layer, at least one other chalcogenide glass layer, said metal containing layer being provided between said at least one chalcogenide glass layer and said at least one other chalcogenide glass layer, said memory element being constructed and arranged such that a resistance value of said memory element switches from a higher to lower resistance state upon application of a first positive voltage and from a lower to higher resistance state upon application of a second positive voltage.

61. The system of claim 60 wherein said chalcogenide glass layer comprises a material having the formula $Ge_xSe_{100-x}$, wherein x=18 to 43.

62. The system of claim 61 wherein said chalcogenide glass layer stoichiometry is about $Ge_{40}Se_{60}$.

63. The system of claim 60 wherein at least one of said glass layers contains a metal dopant.

64. The system of claim 63 wherein said metal dopant comprises silver.

65. The system of claim 61 further comprising another metal containing layer in contact with said at least one other chalcogenide glass layer and at least one third chalcogenide glass layer in contact with said at least one second metal containing layer.

66. The system of claim 61 wherein said chalcogenide glass layers comprise a plurality of stacked chalcogenide glass layers.

67. The system of claim 61 wherein said metal containing layer comprises a plurality of stacked metal containing layers.

68. The system of claim 61 wherein at least one of said chalcogenide glass layers comprises a metal dopant.

69. The system of claim 61 wherein said metal containing layer comprises a silver-selenide layer.

70. A processor-based system, comprising:
a processor;
a memory circuit connected to said processor, said memory circuit comprising a first electrode;
at least one first chalcogenide glass layer in electrical communication with said first electrode;
at least one first metal containing layer in contact with said at least one first chalcogenide glass layer;
at least one second chalcogenide glass layer in contact with said at least one first metal containing layer;
at least one second metal containing layer in contact with said at least one second chalcogenide glass layer;
at least one third chalcogenide glass layer in contact with said at least one second metal containing layer; and
a second electrode in electrical communication with said at least one third chalcogenide glass layer, said memory circuit being constructed and arranged such that a resistance value of said memory circuit switches from a higher to lower resistance state upon application of a first positive voltage and from a lower to higher resistance state upon application of a second positive voltage.

71. The system of claim 70 wherein said metal containing layers comprise one or more silver-selenide layers.

72. The system of claim 71 wherein one or more of said chalcogenide glass layers comprise a plurality of chalcogenide glass layers.

73. The system of claim 70 wherein one or more of said metal containing layers comprises a plurality of metal containing layers.

74. The system of claim 70 wherein one or more of said chalcogenide glass layers contains a metal dopant.

75. The system of claim 74 wherein said metal dopant comprises silver.

76. A memory element comprising:
a first electrode;
a second electrode; and
a plurality of chalcogenide glass layers and at least one metal containing layers arranged between said first and second electrodes, whereby said plurality of chalcogenide glass layers alternate with said at least one metal containing layers, with one of said chalcogenide glass layers being in contact with said first electrode and another of said chalcogenide glass layers being in contact with said second electrode, said memory element being constructed and arranged such that a resistance value of said memory element switches from a higher to lower resistance state upon application of a positive voltage in a first voltage range and from a lower to higher resistance state upon application of a positive voltage in an second voltage range.

77. The memory element of claim 76 wherein said at least one metal containing layers comprises one or more silver-selenide layers.

78. The memory element of claim 76 wherein one or more of said plurality of chalcogenide glass layers comprises a plurality of chalcogenide glass layers.

79. The memory element of claim 76 wherein one or more of said at least one metal containing layers comprises a plurality of metal containing layers.

80. The memory element of claim 76 wherein one or more of said plurality of chalcogenide glass layers contains a metal dopant.

81. The memory element of claim 80 wherein said metal dopant comprises silver.

82. A resistance variable memory element comprising a PCRAM stack including amorphous semiconducting glass layers separated by a layer of silver-containing material, wherein the resistance variable memory element switches to a low resistance state upon application of a first positive write pulse, and switches to a high resistance state by application of a second positive write pulse.

83. A resistance variable memory element as in claim 82 wherein the amorphous semiconducting glass layers include chalcogenide glass.

84. A resistance variable memory element as in claim 82 wherein a time duration of the first and second positive write pulses is less than about 8 nanoseconds.

85. A resistance variable memory element as in claim 82, wherein the first positive write pulse has a magnitude of between about 700 mV and about 1 V.

86. A resistance variable memory element as in claim 82 wherein the first positive write pulse has a magnitude of about 700 mV.

87. A resistance variable memory element as in claim 82 wherein the low resistance state is about 10K Ohm.

88. A resistance variable memory element as in claim 82 wherein the second positive write pulse has a magnitude of at least about 1.5 V.

89. A resistance variable memory element as in claim 88 wherein the high resistance state is in the Megohm range.

90. A resistance variable memory element comprising a PCRAM stack including amorphous semiconducting glass layers separated by a layer of silver-containing material, wherein a resistance value of the resistance variable memory element is switchable between two discrete states, one lower and the other high, upon application of respective positive voltages.

* * * * *